United States Patent
Wang et al.

(10) Patent No.: US 7,839,681 B2
(45) Date of Patent: Nov. 23, 2010

(54) PUSH-PULL FPGA CELL

(75) Inventors: Zhigang Wang, Sunnyvale, CA (US); Fethi Dhaoui, Patterson, CA (US); Michael Sadd, Austin, TX (US); John McCollum, Saratoga, CA (US); Frank Hawley, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 174 days.

(21) Appl. No.: 12/334,059

(22) Filed: Dec. 12, 2008

(65) Prior Publication Data

US 2010/0149873 A1 Jun. 17, 2010

(51) Int. Cl.
*G11C 11/34* (2006.01)

(52) U.S. Cl. ............ 365/185.05; 365/185.06; 365/185.14

(58) Field of Classification Search ............ 365/185.05, 365/185.06, 185.14
See application file for complete search history.

(56) References Cited

U.S. PATENT DOCUMENTS

| | | | |
|---|---|---|---|
| 5,576,568 A | 11/1996 | Kowshik | |
| 5,587,603 A | 12/1996 | Kowshik | |
| 5,625,211 A | 4/1997 | Kowshik | |
| 5,812,452 A * | 9/1998 | Hoang | 365/185.11 |
| 6,100,560 A | 8/2000 | Lovett | |
| 6,144,580 A | 11/2000 | Murray | |
| 6,222,774 B1 * | 4/2001 | Tanzawa et al. | 365/185.29 |
| 6,324,102 B1 | 11/2001 | McCollum | |
| 6,356,478 B1 | 3/2002 | McCollum | |
| 6,891,769 B2 | 5/2005 | McCollum et al. | |
| 6,970,383 B1 | 11/2005 | Han et al. | |
| 7,120,053 B2 * | 10/2006 | Atsumi et al. | 365/185.04 |
| 7,120,079 B2 | 10/2006 | McCollum et al. | |
| 7,187,610 B1 | 3/2007 | McCollum et al. | |
| 7,245,535 B2 | 7/2007 | McCollum et al. | |
| 7,301,821 B1 | 11/2007 | Greene et al. | |
| 7,368,789 B1 | 5/2008 | Dhaoui et al. | |
| 7,430,137 B2 | 9/2008 | Greene et al. | |
| 7,499,360 B2 | 3/2009 | McCollum | |
| 2008/0279028 A1 | 11/2008 | McCollum et al. | |

OTHER PUBLICATIONS

Co-pending U.S. Appl. No. 11/851,324, filed Sep. 6, 2007 entitled Programmable Memory Cell and Array for Programmable Logic Including Trench Isolation.
Co-pending U.S. Appl. No. 12/177,680, filed Jul. 22, 2008 entitled Split Gate Memory Cell for Programmable Circuit Device.
Co-pending U.S. Appl. No. 12/343,308, filed Dec. 23, 2008 entitled Push-Pull Memory Cell Configured for Simultaneous Programming of N-Channel and P-Channel Non-Volatile Transistors.
Co-pending U.S. Appl. No. 12/371,483, filed Feb. 13, 2009 entitled Array and Control Method for Flash Based FPGA Cell.

* cited by examiner

*Primary Examiner*—Son Dinh
(74) *Attorney, Agent, or Firm*—Lewis and Roca LLP

(57) ABSTRACT

A flash memory cell includes a p-channel flash transistor having a source, a drain, a floating gate, and a control gate, an n-channel flash transistor having a source, a drain coupled to the drain of the p-channel flash transistor, a floating gate, and a control gate, a switch transistor having a gate coupled to the drains of the p-channel flash transistor and the n-channel flash transistor, a source, and a drain, and an n-channel assist transistor having a drain coupled to the drains of the p-channel flash transistor and the n-channel flash transistor, a source coupled to a fixed potential, and a gate.

6 Claims, 2 Drawing Sheets

US 7,839,681 B2

PUSH-PULL FPGA CELL

BACKGROUND OF THE INVENTION

1. Field of the Invention

The present invention relates to non-volatile memory cells. More particularly, the present invention relates to push-pull non-volatile memory cells and to arrays of such memory cells.

2. The Prior Art

Push-pull non-volatile memory cells are known in the art. FIG. 1 is a schematic diagram shows an illustrative prior-art push-pull non-volatile memory cell. The memory cell includes a p-channel non-volatile memory transistor connected in series with an n-channel non-volatile transistor. The p-channel non-volatile memory transistor and the n-channel non-volatile transistor may be fabricated as floating-gate flash transistors or may be fabricated using other known non-volatile transistor technologies.

The memory cell shown in FIG. 1 may be used to drive a switch transistor such as the n-channel transistor shown with its gate coupled to the common drain connections of the p-channel non-volatile memory transistor and the n-channel non-volatile transistor. Such a memory cell arrangement may be used to form programmable circuit connections in a programmable integrated circuit such as a field programmable gate array (FPGA) integrated circuit.

The memory cell shown in FIG. 1 may be programmed into one of two states. In the first state, the n-channel non-volatile transistor is turned on and the p-channel non-volatile transistor is turned off. In this state, the gate of the n-channel switch transistor is grounded, turning it off. In the second state, the p-channel non-volatile transistor is turned on and the n-channel non-volatile transistor is turned off. In this state, the gate of the n-channel switch transistor is at approximately $V_{DD}$, turning it on.

In the case of flash non-volatile memory transistors, the p-channel non-volatile transistor is programmed by placing a negative voltage, such as −4v, on the source of the p-channel non-volatile transistor, placing a positive voltage such as 8.5v on its gate, while its bulk is biased at a voltage such as 1.2v. The gate and source of the p-channel non-volatile transistor are biased at 0v during this procedure.

The n-channel flash non-volatile transistor is programmed by placing a voltage such as 8.5v, on its gate, and placing a voltage such as 4.5v on its source. The gate of the p-channel non-volatile transistor is biased at a voltage such as −3.3v and its source is biased at a voltage such as 0v during this procedure.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
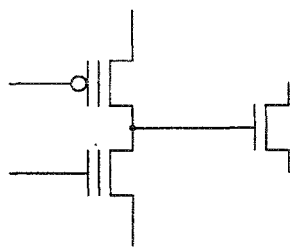
FIG. 1 is a schematic diagram of an illustrative prior-art push-pull non-volatile memory cell.
Figure 2:
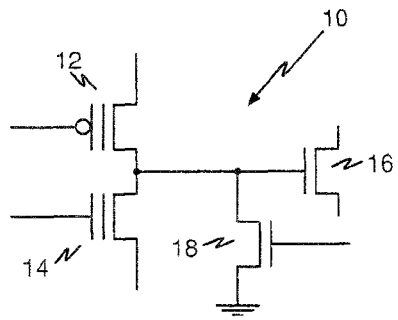
FIG. 2 is a schematic diagram of an illustrative push-pull non-volatile memory cell according to one aspect of the present invention.

Referring now to FIG. 2, a schematic diagram shows an illustrative push-pull non-volatile flash memory cell 10 according to one aspect of the present invention. Memory cell 10 includes a p-channel flash transistor 12 connected in series with an n-channel flash transistor 14. An n-channel switch transistor 16 has its gate connected to the common drain connections of the p-channel flash transistor 12 and the n-channel flash transistor 14. The n-channel switch transistor may be used to make programmable connections between circuit nodes coupled to its source and drain to form programmable circuits as is known in the art. An additional n-channel assist transistor 18 has its drain connected to the common drain connections of the p-channel flash transistor 12 and the n-channel flash transistor 14 and its source connected to ground. The p-channel non-volatile memory transistor and the n-channel non-volatile transistor are disclosed in the specific example herein as employing flash technology, but persons of ordinary skill in the art will appreciate that they may be fabricated as floating-gate flash transistors or may be fabricated using other known non-volatile transistor technologies.

To program p-channel flash transistor 12, a voltage such as 8.5v is applied to its control gate, a negative voltage such as −4v is applied to its source, and a voltage such as 1.2v is applied to the n-well in which p-channel flash transistor 12 is formed. Ground potential (0v) is applied to the control gate of n-channel flash transistor 14 and to the gate of n-channel assist transistor 18. The drain of n-channel flash transistor 14 may be left floating. The p-channel flash transistor is programmed using band-to-band (BTB) programming.

To program n-channel flash transistor 14, a voltage such as 8.5v is applied to its control gate, and a voltage such as 4.5v is applied to its source. Ground potential (0v) is applied to the source of the p-channel flash transistor 12 and a negative voltage such as −3.3v is applied to its control gate. A voltage such as 3.3v is applied to the gate of n-channel assist transistor 18. The n-channel flash transistor 14 is programmed using hot carrier injection (HCI) programming. The n-channel assist transistor 18 in the memory cell 10 is employed to pass HCI programming current for programming the n-channel flash transistor 14 in the cell. The programming voltages suggested for programming transistors 12 and 14 may scale depending on feature size and/or the memory technology employed. Persons of ordinary skill in the art will readily appreciate what voltages to employ to program memory transistors 12 and 14 in any given non-volatile memory technology.

Figure 3:
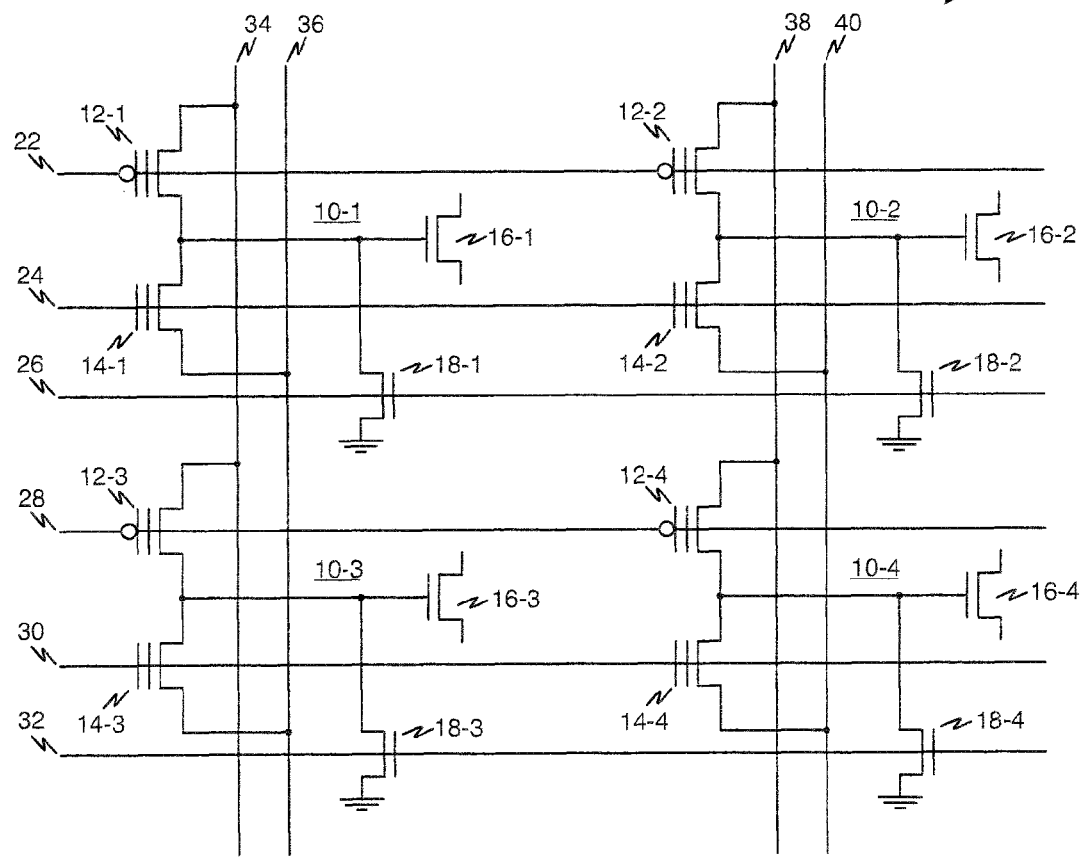
FIG. 3 is a schematic diagram of a portion of an illustrative array of push-pull non-volatile memory cells according to one aspect of the present invention.

Referring now to FIG. 3, a schematic diagram shows a portion 20 of an illustrative array of push-pull non-volatile memory cells according to one aspect of the present invention. The portion 20 of the array shown in FIG. 3 includes memory cells 10-1 and 10-2 in a first row of the array, and memory cells 10-3 and 10-4 in a second row of the array. Memory cells 10-1 and 10-3 are in a first column of the array and memory cells 10-2 and 10-4 are in a second column of the array.

The control gates of p-channel flash transistors 12-1 and 12-2 in memory cells 10-1 and 10-2 in the first row of the array are connected together to a p-channel row line 22. The control gates of n-channel flash transistors 14-1 and 14-2 in memory cells 10-1 and 10-2 are connected together to an n-channel row line 24. The gates of n-channel assist transistors 18-1 and 18-2 in memory cells 10-1 and 10-2 are connected to a row line 26. The control gates of p-channel flash transistors 12-3 and 12-4 in memory cells 10-3 and 10-4 in the second row of the array are connected together to a p-channel row line 28. The control gates of n-channel flash transistors 14-3 and 14-4 in memory cells 10-3 and 10-4 are connected together to an n-channel row line 30. The gates of n-channel assist transistors 18-3 and 18-4 in memory cells 10-3 and 10-4 are connected to a row line 32.

The sources of p-channel flash transistors 12-1 and 12-3 in memory cells 10-1 and 10-3 in the first column of the array are connected together to a p-channel column line 34. The sources of n-channel flash transistors 14-1 and 14-3 in memory cells 10-1 and 10-3 are connected together to an n-channel column line 36. The sources of p-channel flash transistors 12-2 and 12-4 in memory cells 10-2 and 10-4 in the second column of the array are connected together to a p-channel column line 38. The sources of n-channel flash transistors 14-2 and 14-3 in memory cells 10-2 and 10-4 are connected together to an n-channel column line 40.

When programming the p-channel flash transistors in the array, the p-channel row lines containing cells that are unselected are driven to 0v. The p-channel and n-channel column lines containing cells that are unselected are driven to a voltage that will minimize gate disturb of the memory cells on the unselected column lines, such as about 2-5 volts. When programming the n-channel flash transistors in the array, the n-channel row lines containing cells that are unselected are driven to 0v. The p-channel and n-channel column lines containing cells that are unselected are driven to a voltage that will minimize gate disturb of the memory cells on the unselected column lines, such as about 2-5 volts.

To simultaneously erase both the p-channel and n-channel flash transistors in all of memory cells 10-1 through 10-4, a negative voltage such as −8.5 volts is applied to all of row lines 22, 24, 26, 28, 30, and 32, p-channel and n-channel column lines 34, 36, 38, and 40 are allowed to float, and a voltage such as 1.2v is applied to the sources and drains of switch transistors 16-1 through 16-4.

The erase mechanism of the memory cells of the present invention is Fowler-Nordheim tunneling (FN). Because of this, the p-channel and n-channel flash transistors 12 and 14 need coupling ratios that are about 10% better than normal flash cells because the p-well/n-well bias can not be more than the switch transistor oxide tolerance level. The p-channel and n-channel flash transistor size is independent when programming using HCI because the majority program current is passed from the n-channel assist transistors 18.

The memory cell of FIG. 2 has the advantage that an independent read of the status of the n-channel and p-channel transistors 12 and 14 is performed without disturbing the other one of the transistors 12 and 14. Reading one of the n-channel and p-channel transistors 12 and 14 using transistor 18 does not require driving the gate of the other one of n-channel and p-channel transistors 12 and 14.

Figure 4:
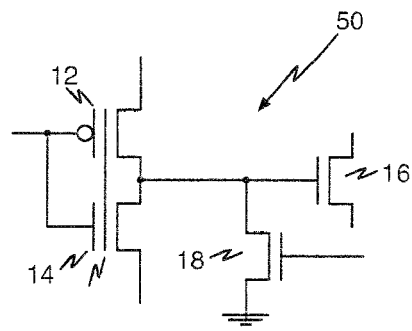
FIG. 4 is a schematic diagram of an illustrative push-pull non-volatile memory cell according to one aspect of the present invention.

Referring now to FIG. 4, a schematic diagram shows an illustrative push-pull non-volatile memory cell 50 according to another aspect of the present invention. Memory cell 50 is almost identical to memory cell 10 of FIG. 2 and includes a p-channel flash transistor 12 connected in series with an n-channel flash transistor 14. An n-channel switch transistor 16 has its gate connected to the common drain connections of the p-channel flash transistor 12 and the n-channel flash transistor 14. An additional n-channel assist transistor 18 has its drain connected to the common drain connections of the p-channel flash transistor 12 and the n-channel flash transistor 14 and its source connected to ground. The difference between memory cell 10 of FIG. 2 and memory cell 50 of FIG. 4 is that p-channel flash transistor 12 and the n-channel flash transistor 14 in memory cell 50 of FIG. 4 share a common floating gate.

One advantage of the memory cell 50 of FIG. 4 is that only the n-channel flash transistor 14 needs to be erased and programmed since it shares its floating gate with the p-channel flash transistor 12. Thus the programming circuitry that needs to be provided is less complicated since it only has to be used to provide the voltages necessary to program the n-channel flash transistor 14.

Figure 5:
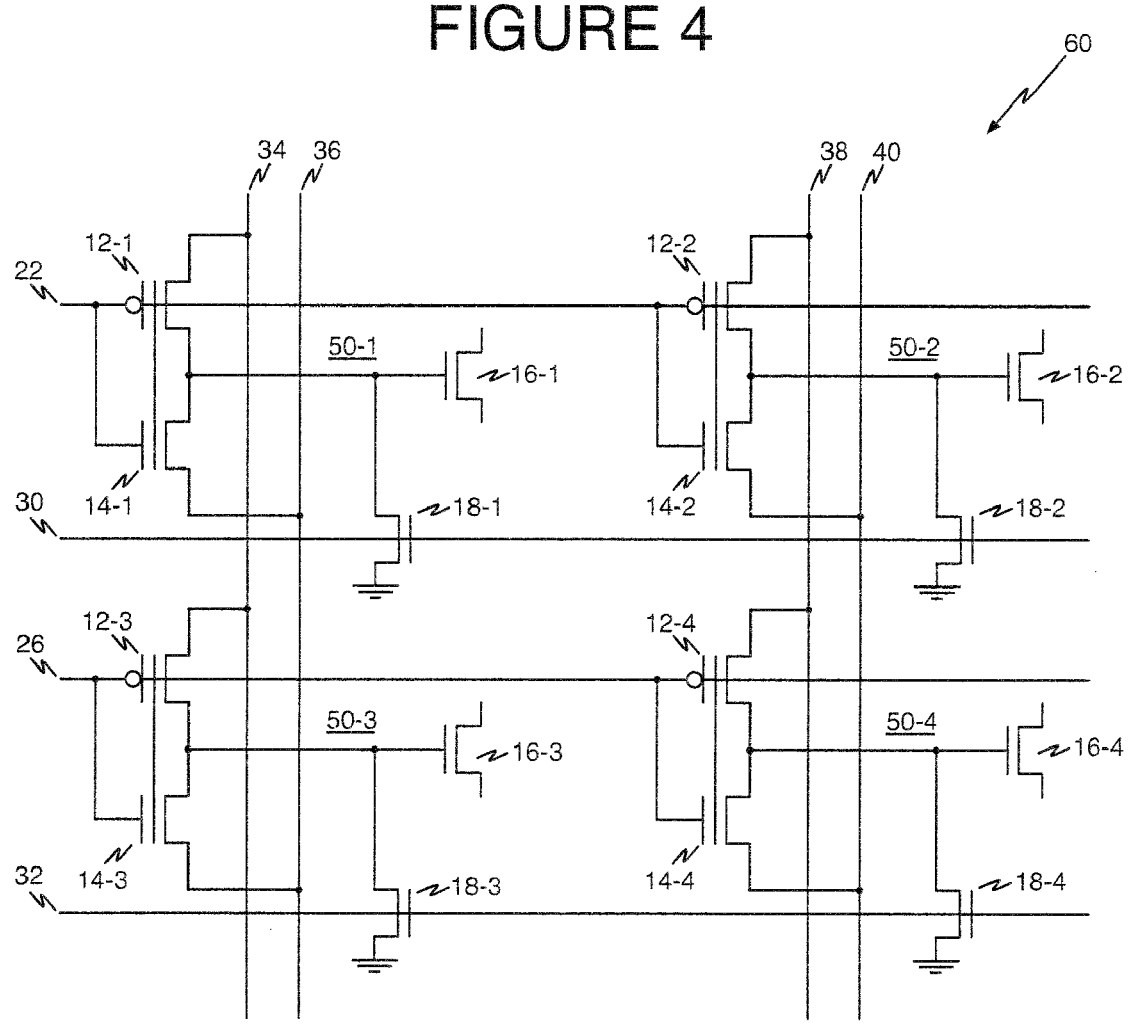
FIG. 5 is a schematic diagram of a portion of an illustrative array of push-pull non-volatile memory cells according to one aspect of the present invention.

Referring now to FIG. 5, a schematic diagram shows a portion 60 of an illustrative array of push-pull non-volatile memory cells according to another aspect of the present invention. The portion 60 of the array shown in FIG. 5 uses the memory cell depicted in FIG. 4 in which the p-channel and n-channel flash transistors share a common floating gate.

The portion 60 of the memory cell array shown in FIG. 5 includes memory cells 50-1 and 50-2 in a first row of the array, and memory cells 50-3 and 50-4 in a second row of the array. Memory cells 50-1 and 50-3 are in a first column of the array and memory cells 50-2 and 50-4 are in a second column of the array.

The control gates of p-channel flash transistors 12-1 and 12-2 in memory cells 50-1 and 50-2 in the first row of the array are connected together to a row line 22. The control gates of n-channel flash transistors 14-1 and 14-2 in memory cells 10-1 and 10-2 are also connected together to p-channel row line 22. Separate row lines for the control gates of each of the p-channel and n-channel flash transistors seen in the embodiment of FIG. 3 are not used. The gates of n-channel assist transistors 18-1 and 18-2 in memory cells 10-1 and 10-2 are connected to a row line 26. The control gates of p-channel flash transistors 12-3 and 12-4 and n-channel flash transistors 14-3 and 14-4 in memory cells 10-3 and 10-4 in the second row of the array are connected together to a row line 28. The gates of n-channel assist transistors 18-3 and 18-4 in memory cells 10-3 and 10-4 are connected to a row line 32. The row lines are connected to row-access circuitry as is known in the art.

The sources of p-channel flash transistors 12-1 and 12-3 in memory cells 10-1 and 10-3 in the first column of the array are connected together to a p-channel column line 34. The sources of n-channel flash transistors 14-1 and 14-3 in memory cells 10-1 and 10-3 are connected together to an n-channel column line 36. The sources of p-channel flash transistors 12-2 and 12-4 in memory cells 10-2 and 10-4 in the second column of the array are connected together to a p-channel column line 38. The sources of n-channel flash transistors 14-2 and 14-3 in memory cells 10-2 and 10-4 are connected together to an n-channel column line 40.

To program memory cells in the array of FIG. 5, the p-channel column lines 34, and 38 are allowed to float. The ones of the n-channel column lines 36 and 40 for columns not containing the memory cell to be programmed are also allowed to float. Only the n-channel column line for the column containing the memory cell to be programmed is driven to a voltage such as 4.5v. The one of lines 22 and 26 for the row containing the memory cell to be programmed is driven to a voltage such as 8.5v. The other row lines in the array are driven to 0v. The one of row lines 30 and 32 containing the memory cell to be programmed is driven to a voltage such as 3.3v. The other ones of row lines 30 and 32 not containing the memory cell to be programmed may driven to a voltage such as either 0v or 3.3v. The mechanism used to program the selected memory cell is HCI programming.

In order to simultaneously erase all of the memory cells in array 50, all of the column lines 34, 36, 38, and 40 are allowed to float. A voltage such as 7v is applied to the wells containing the n-channel and p-channel flash transistors. A negative voltage such as −8.5v is applied to the control gates of the n-channel and p-channel flash transistors on row lines 22 and 26. A voltage such as 1.2v is applied to the sources and drains of the switch transistors, and a voltage such as 3.3v is applied to the gates of the n-channel assist transistors on row lines 30 and 32.

During normal operation, 0v is applied to the gates of the n-channel assist transistors 18-1 through 18-4 to turn them off. A voltage such as 3.3v is applied to p-channel column lines 34 and 38, and 0v is applied to n-channel column lines 36 and 40. A voltage such as 3.3v is applied to the control gates of the n-channel and p-channel flash transistors on row lines 22 and 26.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A flash memory cell including:
   a p-channel flash transistor having a source, a drain, a floating gate, and a control gate;
   an n-channel flash transistor having a source, a drain coupled to the drain of the p-channel flash transistor, a floating gate, and a control gate;
   a switch transistor having a gate coupled to the drains of the p-channel flash transistor and the n-channel flash transistor, a source, and a drain; and
   an n-channel assist transistor having a drain coupled to the drains of the p-channel flash transistor and the n-channel flash transistor, a source coupled to a fixed potential, and a gate.

2. The flash memory cell of claim 1 further including:
   a p-channel flash control line coupled to the source of the p-channel flash transistor;
   an n-channel flash control line coupled to the source of the n-channel flash transistor;
   a p-channel control gate line coupled to the control gate of the p-channel flash transistor;
   an n-channel control gate line coupled to the control gate of the n-channel flash transistor; and
   a assist gate line coupled to the gate of the n-channel assist transistor.

3. The flash memory cell of claim 1 wherein the p-channel flash transistor and the n-channel flash transistor share a common floating gate.

4. The flash memory cell of claim 2, further including:
   a p-channel flash control line coupled to the source of the p-channel flash transistor;
   an n-channel flash control line coupled to the source of the n-channel flash transistor;
   a flash control gate line coupled to the control gates of the p-channel flash transistor and the n-channel flash transistor; and
   a assist gate line coupled to the gate of the n-channel assist transistor.

5. A flash memory array arranged in rows and columns of memory cells and including:
   a p-channel column line for each column in the array;
   an n-channel column line for each column in the array;
   a p-channel row line for each row in the array;
   an n-channel row line for each row in the array;
   an assist row line for each row in the array;
   a plurality of memory cells, each memory cell associated with a row and a column in the array and including a p-channel flash transistor having a source coupled to the p-channel column line of the column containing the memory cell, a drain, a floating gate, and a control gate coupled to the p-channel row line of the row containing the memory cell, an n-channel flash transistor having a source coupled to the n-channel column line of the column containing the memory cell, a drain connected to the drain of the p-channel flash transistor, a floating gate, and a control gate coupled to the n-channel row line of the row containing the memory cell, a switch transistor having a gate coupled to the drains of the p-channel flash transistor and the n-channel flash transistor, a source, and a drain, and an n-channel assist transistor having a drain coupled to the drains of the p-channel flash transistor and the n-channel flash transistor, a source coupled to a fixed potential, and a gate coupled to the assist row line of the row containing the memory cell.

6. A flash memory array arranged in rows and columns of memory cells and including:
   a p-channel column line for each column in the array;
   an n-channel column line for each column in the array;
   a flash row line for each row in the array;
   an assist row line for each row in the array;
   a plurality of memory cells, each memory cell associated with a row and a column in the array and including a p-channel flash transistor having a source coupled to the p-channel column line of the column containing the memory cell, a drain, a floating gate, and a control gate coupled to the flash row line of the row containing the memory cell, an n-channel flash transistor having a source coupled to the n-channel column line of the column containing the memory cell, a drain connected to the drain of the p-channel flash transistor, a floating gate common with the floating gate of the p-channel flash transistor, and a control gate coupled to the flash row line of the row containing the memory cell, a switch transistor having a gate coupled to the drains of the p-channel flash transistor and the n-channel flash transistor, a source, and a drain, and an n-channel assist transistor having a drain coupled to the drains of the p-channel flash transistor and the n-channel flash transistor, a source coupled to a fixed potential, and a gate coupled to the assist row line of the row containing the memory cell.

* * * * *